(12) United States Patent
Herbst et al.

(10) Patent No.: US 11,498,878 B2
(45) Date of Patent: *Nov. 15, 2022

(54) COPPER-CERAMIC COMPOSITE

(71) Applicant: Heraeus Deutschland GmbH & Co. KG, Hanau (DE)

(72) Inventors: Kai Herbst, Erlangen (DE); Christian Muschelknautz, Darmstadt (DE); Alexander Rogg, Trabitz (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 1095 days.

This patent is subject to a terminal disclaimer.

(21) Appl. No.: 16/078,182

(22) PCT Filed: Feb. 16, 2017

(86) PCT No.: PCT/EP2017/053451
§ 371 (c)(1),
(2) Date: Aug. 21, 2018

(87) PCT Pub. No.: WO2017/144333
PCT Pub. Date: Aug. 31, 2017

(65) Prior Publication Data
US 2019/0055166 A1 Feb. 21, 2019

(30) Foreign Application Priority Data

Feb. 26, 2016 (DE) .......................... 1020162031120

(51) Int. Cl.
*B22F 7/00* (2006.01)
*C04B 37/02* (2006.01)
(Continued)

(52) U.S. Cl.
CPC ......... *C04B 37/021* (2013.01); *H05K 1/0204* (2013.01); *H05K 1/0306* (2013.01);
(Continued)

(58) Field of Classification Search
None
See application file for complete search history.

(56) References Cited

U.S. PATENT DOCUMENTS

2001/0026863 A1* 10/2001 Hirano .................... B29C 43/18
264/273
2011/0274888 A1 11/2011 Tang et al.
(Continued)

FOREIGN PATENT DOCUMENTS

| CN | 102795875 A | 11/2012 |
| CN | 104072186 A * | 10/2014 |

(Continued)

OTHER PUBLICATIONS

ATN Ceram—Industrial Ceramic Solutions—Aluminum Oxide: AL2O3, 2005 (1 page).
(Continued)

*Primary Examiner* — Seth Dumbris
(74) *Attorney, Agent, or Firm* — Blank Rome LLP

(57) ABSTRACT

The invention relates to a copper-ceramic composite, comprising a ceramic substrate, which contains aluminum oxide, a coating on the ceramic substrate made of copper or a copper alloy, wherein the aluminum oxide has an average grain form factor $R_a(Al_2O_3)$, determined as an arithmetic average value from the form factors of the grains of the aluminum oxide, the copper or the copper alloy has an average grain form factor $R_a(Cu)$, determined as an arithmetic average of the form factors of the grains of the copper or copper alloy, and the average grain form factors of the aluminum oxide and copper or copper alloy meet the following condition: $0.5 \leq R_a(Al_2O_3)/R_a(Cu) \leq 2.0$.

17 Claims, 3 Drawing Sheets

(51) Int. Cl.
  *H05K 1/02* (2006.01)
  *H05K 1/03* (2006.01)
  *H05K 1/09* (2006.01)

(52) U.S. Cl.
  CPC ............ *H05K 1/09* (2013.01); *C04B 2235/78* (2013.01); *C04B 2235/781* (2013.01); *C04B 2235/785* (2013.01); *C04B 2235/786* (2013.01); *C04B 2235/788* (2013.01); *C04B 2237/343* (2013.01); *C04B 2237/407* (2013.01); *C04B 2237/704* (2013.01); *C04B 2237/706* (2013.01); *H05K 2201/10287* (2013.01); *Y10T 428/12056* (2015.01)

(56) References Cited

U.S. PATENT DOCUMENTS

| | | |
|---|---|---|
| 2013/0065067 A1 | 3/2013 | Nishimura et al. |
| 2019/0002358 A1 | 1/2019 | Zeiger et al. |
| 2019/0055167 A1 | 2/2019 | Herbst et al. |

FOREIGN PATENT DOCUMENTS

| | | |
|---|---|---|
| CN | 104755445 A | 7/2015 |
| DE | 4210900 A1 | 10/1993 |
| DE | 102004050792 A1 | 4/2006 |
| DE | 102010047095 A1 | 4/2012 |
| JP | S6228797 A | 2/1987 |
| JP | S62282797 | 2/1987 |
| JP | S62282797 A | 2/1987 |
| JP | 2010120801 A | 6/2010 |
| JP | 2011124585 A | 6/2011 |
| JP | 2012211377 A * | 11/2012 |
| JP | 2014114201 A | 6/2014 |
| JP | 2014222619 A | 11/2014 |
| KR | 10-1522806 | 5/2015 |
| WO | WO-2010049771 A2 | 5/2010 |
| WO | WO-2013008920 A1 | 1/2013 |

OTHER PUBLICATIONS

English Translation of Annex D3 filed with Notice of Opposition against DE102016203112, Jan. 25, 2005 (24 pages).
English translation of Nothing Works Without Suppliers—Rebecca Eisert Interview—Aug. 25, 2016.
English Translation of Notice of Opposition Against German Patent DE102016203112 dated May 26, 2020.
English translation of Presentation Sample: System Plus—Modul IGBT4 FS100R12PT4, May 26, 2020 (9 pages).
Materials—Technical Ceramics—Aluminium Oxide—QSIL Ceramics: Advanced Material Soultions downloaded Nov. 16, 2020 (1 page).
Oxide Ceramics—Aluminum Oxide (Al2O3) the Most Well-Known Oxide Ceramic Material downloaded Nov. 16, 2020 (4 pages).
Feature Analysis and English translation.
Notification of Reason for Refusal in Korean Patent Application No. 10-2018-7025787.
Notice of Final Rejection in Korean Patent Application No. 10-2018-7025787.
SystemPlus Consulting, Electronic Costing & Technology Experts, Reverse Costing Analysis, 2013, 106 pages.
Opposition and English translation against European Patent EP3419952, dated Dec. 29, 2020.
Notice of Final Rejection in Korean Patent Application No. 10-2018702.

* cited by examiner

COPPER-CERAMIC COMPOSITE

CROSS REFERENCE TO RELATED APPLICATIONS

This application is a national stage of International Patent Application No. PCT/EP2017/053451, filed Feb. 16, 2017, which claims the benefit of German Patent Application No. 10 2016 203 112.0, filed Feb. 26, 2016, each of which are hereby incorporated by reference in their entirety.

The present invention relates to a copper-ceramic composite and also a module which contains this composite and can be used in power electronics components.

Ceramic circuit supports are of particular interest in the field of high-power electronics because of their high thermal conductivity, high dimensional stability or mechanical strength and also their high insulation strength.

Various processes such as direct copper bonding (usually referred to as DCB process) or active metal brazing (usually referred to as AMB process) are available for metallizing a ceramic substrate.

The composite material obtained after metallization of the ceramic substrate is also referred to as metal-ceramic substrate or metal-ceramic composite. If it has, for example, been produced by a DCB process, the term "DCB substrate" is frequently also used.

The DCB process exploits the fact that oxygen reduces the melting point of copper of 1083° C. to the eutectic melting point of 1065° C. The oxidation of copper foils before metallization of the ceramic substrate or introduction of oxygen during the high-temperature process (for example at a temperature in the range from 1065° C. to 1080° C.) forms a thin eutectic melt layer. This reacts with the surface of the ceramic substrate, so that ceramic and metal can be bonded firmly to one another.

DCB processes are described, for example, in U.S. Pat. No. 3,744,120 or DE 23 19 854.

The metallization can, for example, be carried out on only one side of the ceramic substrate ("single layer bonding" SLB) or as an alternative simultaneously on both sides of the ceramic substrate ("double layer bonding" DLB). It is also possible firstly to metallize a first side of the substrate by means of a first SLB step and subsequently also metallize the opposite side of the substrate in a further SLB step.

Structuring the applied metal coating for the formation of conductor tracks, for example by etching processes, is also known.

In many applications of power electronics, the metal-ceramic composite is subjected to high temperature-change stresses, in the case of which significant temperature changes (e.g. in the range from −40° C. to +150° C.) can occur.

Due to the different coefficients of thermal expansion of the ceramic substrate and of the metal coating, considerable mechanical stresses arise at the transition between these layers in the event of temperature fluctuations, and these can ultimately lead to at least partial detachment of the metal from the ceramic surface. It is known that a specific structuring of the metal layer on a macroscopic level in its peripheral region can reduce tensile and compressive stresses and thus improve the thermal shock resistance. DE 40 04 844 and DE4318241 A1 describe metal coatings on ceramic substrates, which coatings have peripheral weakenings in the form of depressions or holes at their edges.

Apart from the thermal shock resistance, further relevant properties of a copper-ceramic composite for applications in electronics are the thermal conductivity and mechanical strength thereof (in particular the thermal conductivity and mechanical strength of the ceramic substrate), good bonding behavior of the copper coating in respect of bonding wires and also very strong bonding of the metal coating to the ceramic surface; this bond should remain sufficiently strong even under prolonged temperature change stresses.

In DE 10 2012 110 322, the ceramic substrate of the metal-ceramic composite is defined in more detail in respect of its grain structure (i.e. its structure on a microscopic level). The ceramic substrate contains an aluminum oxide reinforced with zirconium oxide, with the average grain size of the aluminum oxide being in the range of 2-8 μm and the ratio of the length of the grain boundaries of $Al_2O_3$ grains to the total length of all grain boundaries being >0.6. According to DE 10 2012 110 322, this grain structure contributes to improving the thermal conductivity.

DETAILED DESCRIPTION OF THE INVENTION

It is an object of the present invention to provide a metal-ceramic composite having an improved property profile, in particular improved thermal shock resistance.

The object is achieved by a copper-ceramic composite comprising a ceramic substrate containing aluminum oxide, a coating composed of copper or a copper alloy present on the ceramic substrate, wherein the grains of the aluminum oxide each have a maximum diameter $d_{Kmax}$, a diameter $d_{K,ortho}$ running perpendicular to $d_{K,max}$, determined on half the length of $d_{K,max}$, and a shape factor $R_K(Al_2O_3)=d_{K,ortho}/d_{K,max}$ and the aluminum oxide has an average grain shape factor $R_a(Al_2O_3)$, determined as arithmetic mean of the shape factors $R_K(Al_2O_3)$ of the grains of the aluminum oxide, the grains of the copper or of the copper alloy each have a maximum diameter $d_{K,max}$, a diameter $d_{K,ortho}$ running perpendicular to $d_{K,max}$, determined on half the length of $d_{K,max}$, and a shape factor $R_K(Cu)=d_{K,ortho}/d_{K,max}$ and the copper or the copper alloy has an average grain shape factor $R_a(Cu)$, determined as arithmetic mean of the shape factors $R_K(Cu)$ of the grains of the copper or of the copper alloy, where the average grain shape factors of the aluminum oxide and of the copper or the copper alloy satisfy the following condition:

$$0.5 \leq R_a(Al_2O_3)/R_a(Cu) \leq 2.0.$$

Both the copper coating and also the ceramic substrate of a copper-ceramic composite are generally polycrystalline materials consisting of small crystallites (which are also referred to as grains). On a microscopic level, polycrystalline materials can be characterized in more detail in terms of their grain structure (e.g. grain size distributions, shape of the grains, texture, . . . etc.).

Figure 1:
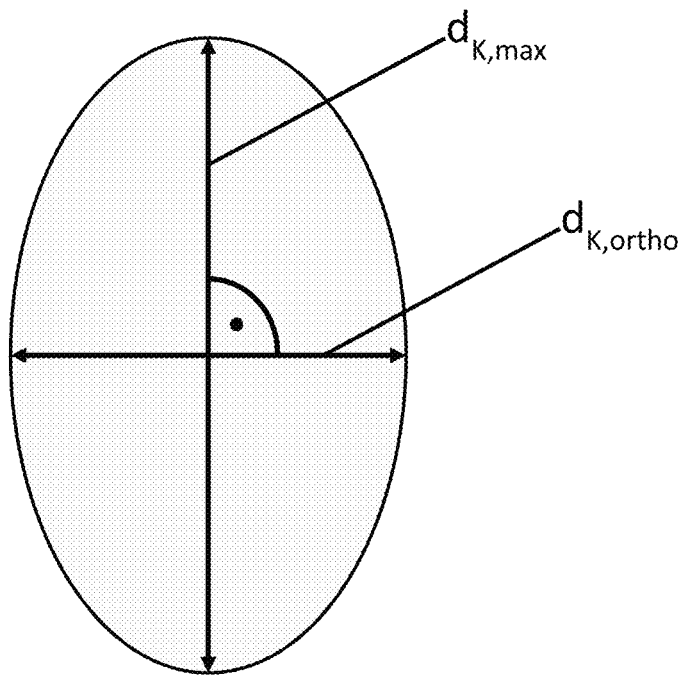
FIG. 1 is an illustration of a grain having an elliptical grain structure.

The shape of an individual grain can be expressed by means of its shape factor $R_K$, which is the ratio of the maximum grain diameter $d_{K,max}$ to the diameter $d_{K,ortho}$ running perpendicular to $d_{K,max}$, determined on half the length of $d_{K,max}$ (i.e. $R_K = d_{K,ortho}/d_{K,max}$). This is shown schematically in FIG. 1 for a grain having an elliptical grain structure.

The average grain shape factor $R_a$ of the material is obtained from the arithmetic mean of the shape factors $R_K$ of the grains. If a material contains, for example, a high proportion of elongated grains, the average grain shape factor of this material will assume a relatively low value. On the other hand, the average grain shape factor approaches the value 1.0, the higher the proportion of round, circular grains.

In the context of the present invention, it has surprisingly been found that the thermal shock resistance of a copper-ceramic composite can be improved when the grains of the copper or of the copper alloy of the metal coating and the grains of the aluminum oxide of the ceramic substrate have a similar shape and the average grain shape factors of the aluminum oxide and of the copper or the copper alloy therefore satisfy the following condition:

$$0.5 \leq R_a(Al_2O_3)/R_a(Cu) \leq 2.0.$$

According to the invention, thermal shock resistance is the resistance or the resistance capability of the copper layer to delamination from the ceramic of a copper-ceramic substrate, with the resistance being determined subsequent to at least one temperature change of the copper layer relative to the ceramic. An improved thermal shock resistance means that the number of temperature changes withstood increases.

According to the invention, improved wire bonding means that the force required to detach the bond wire from the copper surface of a copper-ceramic composite is increased.

Figure 2:
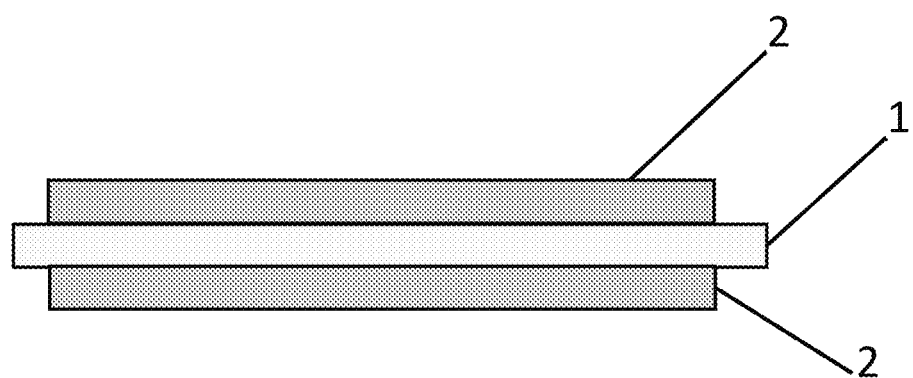
FIG. 2 is an illustration of a copper-ceramic composite.
Figure 3:
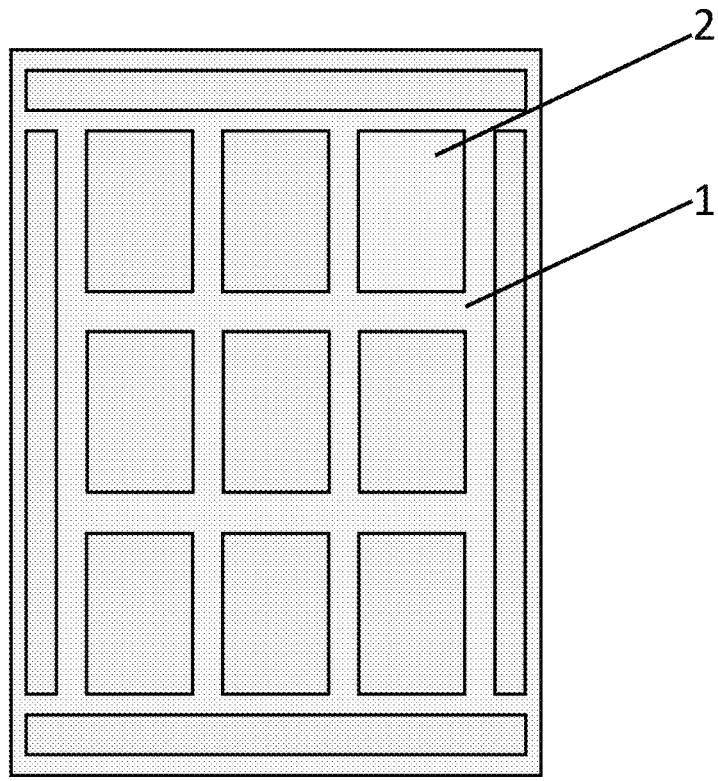
FIG. 3 is a schematic illustration showing the longest dimension $d_{K,max}$ and diameter $d_{K,ortho}$, of running perpendicular to $d_{K,max}$ for determination of the shape factor of an individual grain.

According to the invention, an improved copper adhesion strength is an adhesive strength of the copper relative to the copper-ceramic composite, so that the force required to detach the bonded copper foil from the ceramic surface of a copper-ceramic composite is increased. An illustrative measurement method is known to a person skilled in the art from DE102004012231B4 (FIGS. 2 and 3 of DE102004012231B4).

According to the invention, an improved flexural fracture strength of the ceramic means that the force leading to fracture in a three-point bending test is increased. An example of a flexural fracture strength determination of the ceramic will be known to a person skilled in the art from DIN EN 843-1 (2008). The specimen geometry preferably deviates from that in DIN EN 843-1 (2008) in that the specimens have dimensions of 20×40×0.38 mm³ or 20×40×0.63 mm³.

The ratio of the average grain shape factor of the aluminum oxide to the average grain shape factor of the copper or of the copper alloy is preferably in the range of 0.75-1.50, more preferably in the range of 0.80-1.20.

The average grain shape factor $R_a(Al_2O_3)$ of the aluminum oxide is preferably ≥0.40, more preferably ≥0.60 or ≥0.80; and the average grain shape factor $R_a(Cu)$ of the copper or of the copper alloy is preferably ≥0.40, more preferably ≥0.60 or ≥0.80; with the proviso that the ratio $R_a(Al_2O_3)/R_a(Cu)$ satisfies the abovementioned conditions.

The grain sizes of the copper or of the copper alloy are preferably in the range of 10 μm to 300 μm, more preferably in the range from 15 μm to 250 μm, even more preferably in the range from 20 μm to 210 μm. In this grain size range, the copper or the copper alloy displays good adhesion to a ceramic substrate even when the copper-ceramic composite is subjected to many temperature change stresses. At the same time, the copper or the copper alloy makes efficient wire bonding possible at these grain sizes. A metal coating displays good wire bonding when a very strong bond to a bond wire can be formed and the risk of undesirable detachment of the bond wire is thereby minimized. In the context of the present invention, these values should not be regarded as strict upper and lower limits for the grain size distribution, but instead can vary by +/−10%. However, in a preferred embodiment, these values are the lower and upper limits of the grain size distribution of the copper or of the copper alloy below and above which the grain size should not go. In this preferred embodiment, the copper or the copper alloy therefore has no grains which are outside the abovementioned ranges. Preference is thus given to $d_{min}(Cu)$ being ≥10 μm and $d_{max}(Cu)$ being ≤300 μm, more preferably $d_{min}(Cu)$ being ≥15 μm and $d_{max}(Cu)$ being ≤250 μm, even more preferably $d_{min}(Cu)$ being ≥20 μm and $d_{max}(Cu)$ being ≤210 μm, where $d_{min}(Cu)$ and $d_{max}(Cu)$ are the minimum and maximum grain sizes of the copper.

Use of a copper starting foil having a suitable grain size distribution enables the desired grain sizes in the copper-ceramic composite to be set. Such copper foils are commercially available or can be obtained by standard methods. A fine adjustment of the grain sizes can optionally be effected by thermal treatment of the starting foil.

As is known in principle to a person skilled in the art, the determination of the grain size distribution can be carried out on the basis of the number of grains (i.e. number distribution) or alternatively on the basis of the mass (i.e. mass distribution) or the volume of the grains. For the purposes of the present invention, the distribution of the grain sizes is determined on the basis of the number of grains.

In a preferred embodiment, the copper or the copper alloy has a number distribution of the grain sizes in which not more than 5% of the grains have a grain size of less than 15 μm, preferably less than 20 μm, more preferably less than 25 μm; and/or in which at least 95% of the grains have a grain size of less than 250 μm, preferably less than 230 μm, more preferably less than 200 μm.

As is generally known, characteristic values of a grain size distribution are, inter alia, the $d_{50}$, the $d_5$ and the $d_{95}$ thereof. The dso, which is frequently also referred to as median value, is defined as follows: 50% of the grains have a diameter which is smaller than the $d_{50}$. Analogously, the $d_5$ is such that 5% of the grains have a diameter which is smaller than this $d_5$, and the $d_{95}$ is such that 95% of the grains have a diameter which is smaller than this $d_{95}$. The arithmetic mean $d_{arith}$ of a grain size distribution is the sum of the grain sizes of the individual grains divided by the number of grains.

The number distribution of the grain sizes of the copper or of the copper alloy preferably has a $d_{95}$ of ≤250 μm, more preferably in the range from 140 μm to 250 μm, even more preferably in the range of 140 μm to 230 μm, still more preferably in the range of 150 μm to 200 μm. The $d_5$ of the grain size number distribution of the copper or of the copper alloy is preferably ≥15 μm; the $d_5$ is more preferably in the range from 15 µm to 80 µm, even more preferably in the range from 20 µm to 75 µm, still more preferably in the range of 25 µm to 70 µm. Further optimization of the thermal shock resistance and the bonding behavior of the copper or of the copper alloy can be achieved in this way.

A preferred $d_{50}$ of the grain size number distribution of the copper or of the copper alloy is, for example, in the range from 55 µm to 115 µm.

For the purposes of the present invention, it can be preferred that the $d_5$, $d_{95}$ and $d_{50}$ values of the grain size number distribution of the copper or of the copper alloy are selected so that they satisfy the following condition:

$$4.0 \geq (d_{95}-d_5)/d_{50} \geq 0.5$$

The symmetry of a grain size distribution can be expressed by the ratio of the median $d_{50}$ to the arithmetic mean $d_{arith}$ of this distribution (i.e. by the ratio $d_{50}/d_{arith}$; hereinafter also referred to as symmetry value S). The closer the symmetry value is to 1.0, the more symmetric is the grain size distribution. In a preferred embodiment, the copper or the copper alloy has a number distribution of the grain sizes having a median value $d_{50}$ and an arithmetic mean $d_{arith}$ where the ratio of $d_{50}$ to $d_{arith}$ (i.e. $d_{50}/d_{arith}$) is in the range from 0.75 to 1.10, more preferably in the range from 0.78 to 1.05, even more preferably in the range from 0.80 to 1.00. Further optimization of the thermal shock resistance and the wire bonding properties can be achieved in this way. Suitable methods by means of which the symmetry of the grain size distribution in the copper, for example already in the copper starting foil, can be set are known to those skilled in the art. For example, the symmetry of the grain size distribution in a copper foil can be influenced by a suitable processing temperature or a rolling process. Copper starting foils by means of which the abovementioned symmetry values can be realized in the final copper-ceramic composite are commercially available or can be obtained by standard methods.

The breadth of the grain size distribution can be expressed by the ratio of $d_5$ to $d_{95}$. In a preferred embodiment, the copper or the copper alloy has a number distribution of the grain sizes having a $d_5$ and a $d_{95}$ where the ratio of $d_5$ to $d_{95}$ is in the range from 0.1 to 0.4, more preferably in the range from 0.11 to 0.35, even more preferably in the range from 0.12 to 0.30. Further optimization of the thermal shock resistance and the wire bonding properties can be achieved in this way.

The average grain shape factor $R_a(Cu)$ of the copper or of the copper alloy is preferably ≥0.40, even more preferably ≥0.60 or ≥0.80. Suitable methods by means of which the shape of the grains in the copper, for example already in the copper starting foil, can be set are known to those skilled in the art. For example, the grain shape in a copper foil can be influenced by a suitable processing temperature or a rolling process. Copper starting foils by means of which the abovementioned average grain shape factor $R_a(Cu)$ can be realized in the final copper-ceramic composite are commercially available or can be obtained by standard methods.

A suitable thickness of the coating composed of copper or of a copper alloy in a copper-ceramic composite is known to those skilled in the art. As explained below, part of the copper or of the copper alloy can be removed at some places in the coating, in particular in peripheral regions, for example to form peripheral weak points. It is therefore possible in the context of the present invention for the thickness of the metal coating to vary. The coating composed of copper or a copper alloy usually has a thickness in the range of 0.2-1.2 mm over at least 70% of its area. For example, it is possible for the thickness to be about 300 µm.

The thickness of the coating composed of copper or a copper alloy ($D_{Cu}$) and the median $d_{50}$ of the grain size number distribution of the copper or of the copper alloy are preferably selected so that the ratio $D_{Cu}$ to $d_{50}$ is in the range from 0.05 to 0.40. For this purpose, the thickness $D_{Cu}$ of the copper or of the copper alloy is determined at one place in the coating and is divided by the median $d_{50}$ of the grain size number distribution of the copper or of the copper alloy. The ratio $D_{Cu}/d_{50}$ is preferably in the range from 0.05 to 0.40 over at least 70%, more preferably at least 90%, of the area of the coating composed of copper or a copper alloy.

The copper of the coating preferably has a purity of ≥99.50%, more preferably ≥99.90%, even more preferably ≥99.95% or even ≥99.99%.

The coating composed of copper or a copper alloy is preferably applied by means of a DCB process to the ceramic substrate. As indicated above, a customary DCB process can, for example, have the following process steps:

Oxidizing a copper foil so that a copper oxide layer is formed on the surface thereof;

Laying the copper foil with the copper oxide layer on the ceramic substrate;

Heating the composite to a temperature of <1083° C. (e.g. a temperature in the range of 1065-1080° C.), Cooling to room temperature.

As a result of the DCB process, spinel crystallites (e.g. copper-aluminum spinels) can be present between the coating composed of copper or a copper alloy and the ceramic substrate.

The coating composed of copper or a copper alloy can, for example, have been applied to only one side of the ceramic substrate. As an alternative, it is possible for both sides (i.e. upper side and underside) of the ceramic substrate to have been provided with the coating composed of copper or a copper alloy. An illustrative copper-ceramic composite in which a ceramic substrate 1 has a coating 2 composed of copper or a copper alloy both on its underside and also on its upper side is shown in FIG. 2. An illustrative copper-ceramic composite in which the ceramic substrate 1 has a plurality of regions which are each provided with a coating 2 composed of copper or copper alloy is shown in FIG. 3. As explained below, the individual metallized regions can be separated from one another by preferential fracture lines (not shown in FIG. 3), so that these regions can be individualized by breaking along these preferential fracture lines.

To form electrical contact areas, the coating composed of copper or a copper alloy can at least partly have structuring. The structuring of the metal coating can be carried out in a known manner, in particular by means of an etching process (for example using an etching mask).

In the etching process, the copper or the copper alloy can be removed completely in subregions, so that the surface of the ceramic substrate is exposed in these subregions. Furthermore, it is also possible for the coating composed of copper or a copper alloy to have one or more depressions (preferably round depressions) which might be obtained in the etching process by the copper or the copper alloy being only partially removed in the region of the depression to be introduced and the surface of the ceramic substrate therefore still being coated with copper or copper alloy in this region. As an alternative or in addition, it is possible to etch the depressions through the copper or the copper alloy through to the ceramic surface. As regards the possible arrangement of such depressions, preferably in the peripheral region of the coatings composed of copper or copper alloy, reference may be made, for example, to DE 40 04 844 C1 and DE 43 18 241 A1.

As indicated above, the ceramic substrate contains aluminum oxide ($Al_2O_3$).

The grain sizes of the aluminum oxide are preferably in the range from 0.01 µm to 25 µm, more preferably in the range from 0.3 µm to 23 µm, even more preferably in the range from 0.5 µm to 20 µm. In the case of grain sizes in this range, the ceramic substrate of the copper-ceramic composite has both a high mechanical strength and also a high thermal conductivity. In the context of the present invention, these values should not be regarded as strict lower and upper limits for the grain size distribution, but can instead vary by +/−10%. However, in a preferred embodiment, these values are the lower limit, below which the grain size does not go, and upper limit, which is not exceeded, of the grain size distribution of the aluminum oxide. In this preferred embodiment, the aluminum oxide therefore does not have any grains which lie outside the abovementioned ranges. Thus, it is preferred that $d_{min}(Al_2O_3)$ is ≥0.01 µm and $d_{max}(Al_2O_3)$ is ≤25 µm, more preferably $d_{min}(Al_2O_3)$ is ≥0.3 µm and $d_{max}(Al_2O_3)$ is ≤23 µm, even more preferably $d_{min}(Al_2O_3)$ is ≥0.5 µm and $d_{max}(Al_2O_3)$ is ≤20 µm, where $d_{min}(Al_2O_3)$ and $d_{max}(Al_2O_3)$ are the minimum and maximum grain sizes of the aluminum oxide.

Use of a ceramic starting material having a suitable $Al_2O_3$ grain size distribution enables the desired $Al_2O_3$ grain sizes in the copper-ceramic composite to be set. Such ceramic materials are commercially available or can be obtained by standard methods. Fine adjustment of the grain sizes can optionally be effected by thermal treatment of the ceramic starting material.

As mentioned above, the distribution of the grain sizes is, for the purposes of the present invention, determined on the basis of the number of grains (i.e. grain size number distribution).

In a preferred embodiment, the aluminum oxide of the ceramic substrate has a number distribution of the grain sizes in which not more than 5% of the grains have a grain size of less than 0.1 µm, more preferably less than 0.3 µm, even more preferably less than 0.5 µm; and/or in which at least 95% of the grains have a grain size of less than 15 µm, more preferably less than 10 µm, even more preferably less than 7 µm.

Further optimization of the mechanical strength and the thermal conductivity of the ceramic substrate in the metal-ceramic composite can be achieved when the $d_5$ and $d_{95}$ values of the grain size distribution of the $Al_2O_3$ satisfy particular requirements.

The number distribution of the grain sizes of the aluminum oxide preferably has a $d_{95}$ of ≤15.0 µm, more preferably in the range from 4.0 µm to 15.0 µm, even more preferably in the range from 4.5 µm to 10.0 µm, still more preferably in the range from 5.0 µm to 8.0 µm. The $d_5$ of the grain size number distribution of the aluminum oxide is preferably ≥0.1 µm; $d_5$ is more preferably in the range from 0.1 µm to 2.5 µm, even more preferably in the range from 0.3 µm to 2.5 µm, still more preferably in the range from 0.5 µm to 2.0 µm. Further optimization of the mechanical strength and the thermal conductivity of the ceramic substrate in the metal-ceramic composite can be achieved in this way.

A preferred $d_{50}$ of the grain size number distribution of the aluminum oxide is, for example, in the range from 1.0 µm to 3.0 µm.

For the purposes of the present invention, it can be preferred that the $d_5$, $d_{95}$ and $d_{50}$ values of the grain size number distribution of the aluminum oxide are selected so that they satisfy the following condition:

$$9.5 \geq (d_{95}-d_5)/d_{50} \geq 0.7$$

In a preferred embodiment, the aluminum oxide has a number distribution of the grain sizes having a median $d_{50}$ and an arithmetic mean $d_{arith}$ such that the ratio of $d_{50}$ to $d_{arith}$ (i.e. $d_{50}/d_{arith}$; hereinafter also referred to as symmetry value $S(Al_2O_3)$ of the grain size number distribution of the aluminum oxide) is in the range from 0.75 to 1.10, more preferably in the range from 0.78 to 1.05, even more preferably in the range from 0.80 to 1.00. Further optimization of the mechanical strength and thermal conductivity of the ceramic substrate in the metal-ceramic composite can be achieved in this way.

Suitable methods by means of which the symmetry of the grain size distribution of the aluminum oxide can be adjusted, for example already in the production of the starting substrate, are known to those skilled in the art. For example, the symmetry of the grain size distribution can be influenced by sintering time and sintering temperature in the production of the starting substrate. $Al_2O_3$ substrates by means of which the abovementioned symmetry values can be realized in the final copper-ceramic composite are commercially available or can be obtained by standard methods.

The breadth of the grain size distribution can be expressed by the ratio of $d_5$ to $d_{95}$. In a preferred embodiment, the aluminum oxide has a number distribution of the grain sizes having a $d_5$ and a $d_{95}$ such that the ratio of $d_5$ to $d_{95}$ is in the range from 0.1 to 0.4, more preferably in the range from 0.11 to 0.35, even more preferably in the range from 0.12 to 0.30. Further optimization of the mechanical strength and thermal conductivity of the ceramic substrate in the metal-ceramic composite can be achieved in this way.

The average grain shape factor $R_a(Al_2O_3)$ of the aluminum oxide is preferably ≥0.40, more preferably ≥0.60, even more preferably ≥0.80. As mentioned above, the shape of an individual grain can be expressed by its shape factor $R_K$ which is the ratio of the maximum grain diameter $d_{K,max}$ to the grain diameter $d_{K,ortho}$ running perpendicular to $d_{K,max}$, determined on half the length of $d_{K,max}$ (i.e. $R_K = d_{K,ortho}/d_{K,max}$). The average grain shape factor $R_a(Al_2O_3)$ of the aluminum oxide is obtained from the arithmetic mean of the shape factors $R_K$ of the grains. Suitable methods by means of which the shape of the aluminum oxide grains can be set, for example already in the production of the starting substrate, are known to those skilled in the art. For example, the shape of the $Al_2O_3$ grains can be influenced by sintering time and sintering temperature in the production of the starting substrate. $Al_2O_3$ substrates by means of which the abovementioned shape factor $R_a(Al_2O_3)$ can be realized in the final copper-ceramic composite are commercially available or can be obtained by standard methods.

A suitable thickness of the ceramic substrate in a copper-ceramic composite is known to those skilled in the art. The ceramic substrate usually has a thickness in the range of 0.2-1.2 mm over at least 70% of its area, more preferably at least 90% of its area. A thickness of the ceramic substrate is, for example, about 0.38 mm or about 0.63 mm.

The thickness of the ceramic substrate ($D_{cer}$) and the median $d_{50}$ of the grain size number distribution of the aluminum oxide in the ceramic substrate are preferably selected so that the ratio $D_{cer}$ to $d_{50}$ (i.e. $D_{cer}/d_{50}$) is in the range from 0.001 to 0.01, more preferably in the range from 0.002 to 0.009, even more preferably in the range from 0.004 to 0.008. For this purpose, the thickness $D_{cer}$ of the ceramic substrate is determined at one place and divided by the median $d_{50}$ of the grain size number distribution of the aluminum oxide. The ratio $D_{cer}/d_{50}$ is preferably in the range from 0.05 to 0.40 over at least 70%, more preferably at least 90%, of the area of the ceramic substrate.

The aluminum oxide can optionally be reinforced with zirconium oxide ($ZrO_2$). Such $ZrO_2$-reinforced $Al_2O_3$ usually contains, based on its total mass, the zirconium oxide in a proportion of 0.5-30% by weight. The zirconium oxide can in turn optionally be doped with one or more doping oxide(s), in particular yttrium oxide, calcium oxide, cerium oxide or magnesium oxide, usually in a proportion of up to 0.01% by weight or even up to 5% by weight, based on the total mass of zirconium oxide and aluminum oxide.

The ceramic substrate preferably contains at least 65% by weight of $Al_2O_3$. If there is no $ZrO_2$ present for reinforcing the $Al_2O_3$, the ceramic substrate may contain at least 95% by weight, preferably 96% by weight, of $Al_2O_3$.

If a $ZrO_2$-reinforced aluminum oxide is used (where the $ZrO_2$ is, as mentioned above, optionally doped), the ceramic substrate may contain at least 96% by weight, more preferably at least 98% by weight, of this $ZrO_2$-reinforced $Al_2O_3$.

The ceramic substrate can, for example, have a thermal conductivity of $\geq 20$ W/mK, and/or a flexural fracture strength of $\geq 400$ MPa.

The ceramic substrate can be present in the form of an individual substrate. As an alternative, it is also possible for the ceramic substrate to have one or more (preferably linear) preferential fracture lines which divide the ceramic substrate into two or more regions and a coating composed of copper or a copper alloy is applied at least in one of these regions. As regards the structure of such a multiple substrate with preferential fracture lines, reference may be made, for example, to DE 43 19 944 A1 and DE 199 27 046 A1.

Suitable dimensions (length×width) of the ceramic substrate (either as individual substrate or as multiple substrate) in a metal-ceramic composite are known to those skilled in the art. For example, the ceramic substrate can have dimensions, length×width, of (180-200 mm)×(130-150 mm) or (180-200 mm)×(270-290 mm). Smaller dimensions, for example (8-12 mm)×(8-12 mm), are also possible.

In a preferred embodiment, the aluminum oxide has grain sizes in the range from $d_{min}(Al_2O_3)$ to $d_{max}(Al_2O_3)$, the copper or the copper alloy has grain sizes in the range from $d_{min}(Cu)$ to $d_{max}(Cu)$, and the ratios of $d_{min}(Al_2O_3)$ to $d_{max}(Cu)$ and of $d_{max}(Al_2O_3)$ to $d_{min}(Cu)$ satisfy the conditions (i) and (ii) below:

$d_{min}(Al_2O_3)/d_{max}(Cu) \geq 1 \times 10^{-5}$ and (i)

$2.5 \geq d_{max}(Al_2O_3)/d_{min}(Cu)$. (ii)

Even more preferably, the ratios of $d_{min}(Al_2O_3)$ to $d_{max}(Cu)$ and of $d_{max}(Al_2O_3)$ to $d_{min}(Cu)$ satisfy the conditions (i) and (ii) below:

$d_{min}(Al_2O_3)/d_{max}(Cu) \geq 0.001$ and (i)

$1.5 \geq d_{max}(Al_2O_3)/d_{min}(Cu)$; (ii)

and most preferably the conditions (i) and (ii) below:

$d_{min}(Al_2O_3)/d_{max}(Cu) \geq 0.002$ and (i)

$1.0 > d_{max}(Al_2O_3)/d_{min}(Cu)$. (ii)

In a particularly preferred embodiment $0.005 \geq d_{min}(Al_2O_3)/d_{max}(Cu) \geq 0.002$ and (i)

$1.0 \geq d_{max}(Al_2O_3)/d_{min}(Cu) \geq 0.05$. (ii)

A strong bond between the metal coating and the ceramic substrate which also withstands frequent temperature change stresses can be realized in this way. Preference is given, as mentioned above, to $d_{min}(Cu)$ being $\geq 10$ μm and $d_{max}(Cu)$ being $\leq 300$ μm, more preferably $d_{min}(Cu)$ being $\geq 15$ μm and $d_{max}(Cu)$ being $\leq 250$ μm, even more preferably $d_{min}(Cu)$ being $\geq 20$ μm and $d_{max}(Cu)$ being $\leq 210$ μm, where $d_{min}(Cu)$ and $d_{max}(Cu)$ are the minimum and maximum grain sizes of the copper.

In a preferred embodiment, the ratio of $d_{50}(Al_2O_3)$ to $d_{50}(Cu)$ is in the range from 0.008 to 0.055, more preferably in the range from 0.010 to 0.045. Further optimization of the adhesion and thermal shock resistance in the metal-ceramic composite can be achieved in this way.

In a preferred embodiment, the copper or the copper alloy has a number distribution of the grain sizes having a median $d_{50}$, an arithmetic mean damn and a symmetry value $S(Cu)=d_{50}/d_{arith}$, and the aluminum oxide has a number distribution of the grain sizes having a median $d_{50}$, an arithmetic mean $d_{arith}$ and a symmetry value $S(Al_2O_3)=d_{50}/d_{arith}$, where $S(Al_2O_3)$ and $S(Cu)$ satisfy the following condition:

$0.7 \leq S(Al_2O_3)/S(Cu) \leq 1.4$.

More preferably, $S(Al_2O_3)$ and $S(Cu)$ satisfy the following condition:

$0.74 \leq S(Al_2O_3)/S(Cu) \leq 1.35$;

even more preferably the following condition $0.80 \leq S(Al_2O_3)/S(Cu) \leq 1.25$.

The thermal shock resistance of the copper-ceramic composite can be improved in this way.

The present invention further provides a module containing at least one copper-ceramic composite as described above and one or more bond wires. The bond wire or the bond wires is/are usually joined to the coating composed of copper or copper alloy. Suitable bonding methods for joining wires to a metal coating are known to those skilled in the art. The module can additionally contain one or more electronic components such as one or more chips.

The grain structures of the aluminum oxide of the ceramic substrate and also of the copper or of the copper alloy of the metal coating are determined as follows for the purposes of the present invention:

Grain Size Distribution of the Aluminum Oxide of the Ceramic Substrate

A scanning electron micrograph (SEM image) is taken of the surface of the ceramic substrate. A special specimen preparation in the form of a polished section is not necessary. The SEM image is taken on a place on the ceramic substrate which had previously been covered with copper and exposed by etching.

The grain sizes are determined by means of a line intercept method. Line intercept methods are known to those skilled in the art and are described, for example, in ASTM 112-13.

The magnification is selected so that at least 50 $Al_2O_3$ grains are intersected by the pattern of lines. If the ceramic substrate also contains grains having a different chemical composition, for example $ZrO_2$ grains, these can readily be distinguished from the $Al_2O_3$ grains in the SEM image by means of secondary electron contrast and are thus not included in the subsequent calculations.

Figure 4:
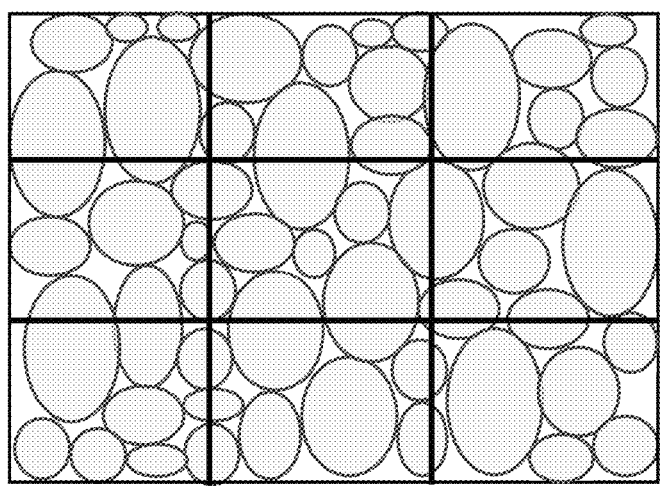
FIG. 4 is a schematic illustration of grains intersected by parallel lines in an x- direction and parallel lines in a y-direction for determination of grain size distribution.

For the purposes of the present invention, two parallel lines are drawn in the x direction and two parallel lines are drawn in the y direction in the optical micrograph. The lines divide the image into three strips of equal width. This is schematically shown in FIG. 4. When a grain is intersected over a length L by one of these lines, this length L is taken as the grain size. A grain size is thus obtained for each grain intersected by one of these lines. At the crossing point of two lines, two values are obtained for one grain, and both of these go into the determination of the grain size distribution.

A grain size distribution is obtained from the grain sizes of the intersected grains, and from this distribution it is in turn possible to determine the $d_5$, $d_{50}$ and $d_{95}$ values and also the arithmetic mean $d_{arith}$.

As is explained above and generally known to a person skilled in the art, the following applies to the $d_{50}$, frequently also referred to as median: 50% of the grains have a diameter which is smaller than the $d_{50}$. In an analogous way, the $d_5$ is the value at which 5% of the grains have a diameter which is smaller than this $d_5$, and the $d_{95}$ is the value at which 95% of the grains have a diameter which is smaller than this $d_{95}$.

The arithmetic mean of the grain size distribution is given by the sum of the grain sizes of the individual grains divided by the number of intersected grains.

Grain Size Distribution of the Copper or the Copper Alloy

An optical micrograph is taken of the surface of the coating composed of copper or a copper alloy (parallel to the coated substrate surface). Special specimen preparation in the form of a polished section is not necessary.

The grain sizes are determined by a line intercept method. Line intercept methods are known to those skilled in the art and are described, for example, in ASTM 112-13.

The magnification is selected so that at least 50 grains are intercepted by the pattern of lines.

As regards the further evaluation by the line intercept method, reference may be made to what has been said above in the case of aluminum oxide.

Both the grain sizes of the copper or the copper alloy and also the grain sizes of the $Al_2O_3$ are thus determined in a plane which runs parallel to the coated substrate surface or is coplanar with the latter.

Shape Factor of Individual Grains, Average Grain Shape Factor

Aluminum Oxide

The SEM image which was used in the determination of the grain size distribution is employed.

To determine the shape factor of an individual grain, the following procedure is employed:

The longest dimension $d_{K,max}$ thereof is determined. The grain diameter $d_{K,ortho}$ running perpendicular to $d_{K,max}$ is subsequently determined on half the length of $d_{K,max}$. The shape factor of the individual grain $R_K$ is given by the ratio of $d_{K,ortho}$ to $d_{K,max}$, i.e. $R_K = d_{K,ortho}/d_{K,max}$. This is shown schematically in FIG. 3 for a grain having an elliptical grain structure. The more the shape of a grain in its two-dimensional projection approaches that of a circle, the more does the shape factor of the grain approach the value 1.0. The shape factor is therefore also a measure of the circularity/roundness of the grains.

The shape factor is determined for at least 50 grains in the SEM image. The grains which were also intercepted by the lines in the line intercept method are usually evaluated.

The average grain shape factor of the aluminum oxide is then given by the arithmetic mean of the shape factors of the individual $Al_2O_3$ grains (i.e. the total of the individual shape factors divided by the number of grains examined).

Copper, Copper Alloy

The optical micrograph which was used in the determination of the grain size distribution is employed.

With regard to the determination of the shape factor of the individual grains and also of the average grain shape factor of the copper or the copper alloy, reference may be made to what has been said above in the case of $Al_2O_3$.

Both the grain shape factors of the copper or of the copper alloy and also the grain shape factors of the $Al_2O_3$ are thus determined in a plane which runs parallel to the coated substrate surface or is coplanar with the latter.

A bonding process which is preferably used for producing the copper-ceramic substrates of the invention is described below:

A typical process which is preferably used in the context of the present invention for applying the copper coating to the ceramic substrate is, for example, known from the documents U.S. Pat. Nos. 3,744,120, 3,994,430, EP 0 085 914 A or DE 23 19 854 A, the corresponding disclosure of which is incorporated by reference into the present invention.

It is common to all the production processes disclosed there, for example in the form of the direct copper bonding process (DCB process), that a copper foil is firstly oxidized in such a way that an essentially uniform copper oxide layer is obtained. The resulting copper foil is then positioned on a ceramic substrate and the composite of ceramic substrate and copper foil is heated to a process or bonding temperature in the range from about 1025 to 1083° C., as a result of which a metallized ceramic substrate is formed. After bonding, the copper foil thus represents a coating. Finally, the resulting metallized ceramic substrate is cooled.

The joining of ceramic substrate and copper foil is carried out in a furnace, with bonding furnaces generally being used. Corresponding bonding furnaces, frequently also referred to as tunnel kilns, comprise, inter alia, an elongated tunnel-like furnace space (also referred to as a muffle) and a transport device having a transport element, for example in the form of a flexible and heat-resistant conveyor belt for transporting the material being treated through the furnace space which is heated by means of a heating device. The ceramic substrates are positioned together with the copper foil on a support on the conveyor belt and subsequently run, driven by the conveyor belt, through a heating region in which the required bonding temperature is attained in the bonding furnace. At the end of the bonding process, the resulting composite of ceramic substrate and copper foil according to the invention is cooled again.

This process can in principle be employed for producing ceramic substrates metallized on one side and also for producing substrates metallized on both sides. The production of substrates metallized on both sides is generally carried out by a two-stage bonding process, i.e. by means of a two-stage single layer process (SLB process). In the context of the invention, preference is given to using a two-stage bonding process.

In this two-stage bonding process for producing ceramic substrates metallized on both sides according to the invention, the ceramic is joined to the copper foils on the opposite sides of the ceramic substrate in two passes through the furnace.

For this purpose, a ceramic substrate is firstly positioned on a support and subsequently covered with a copper foil on the upper side, i.e. on the side facing away from the support. As a result of the action of heat, this side of the ceramic substrate is joined to the metal layer and the resulting arrangement is subsequently cooled.

The substrate is subsequently turned over and the other side of the substrate is provided in the same way with a metal layer, i.e. the copper foil, in a second bonding step.

It is possible to produce individual cards or large cards which have a plurality of individual cards which can be broken out.

EXAMPLES

The following examples show how the thermal shock resistance of the copper-ceramic composite can be improved when the average shape factors of the copper and of the $Al_2O_3$ approximate one another.

Three copper-ceramic specimens were produced by a DCB process:

Copper-ceramic composite 1, hereinafter "K-K-V 1" (according to the invention)

Copper-ceramic composite 2, hereinafter "K-K-V 2" (comparative specimen)

Copper-ceramic composite 3, hereinafter "K-K-V 3" (comparative specimen)

In each of these three copper-ceramic composites, both the upper side and also the underside of the ceramic substrate were provided with a copper coating. The copper coating was firstly bonded by means of the SLB process to one side of the ceramic substrate. The opposite side of the ceramic substrate was subsequently provided by means of the SLB process with a further copper coating so as to form a copper-ceramic substrate in which a copper foil is bonded to each of the two sides of the ceramic. One of the two copper coatings on each of the specimens was subsequently structured by an etching process (same structuring for all specimens). In all examples, the substrates comprised 96% by weight of $Al_2O_3$.

In each of these three copper-ceramic composites, the ceramic substrate had the following dimensions:

Thickness of the ceramic substrate: 0.38 mm;
Length×width of the ceramic substrate: 190×140 mm²

The copper coating in each case had a thickness of 0.3 mm.

Figure 5:
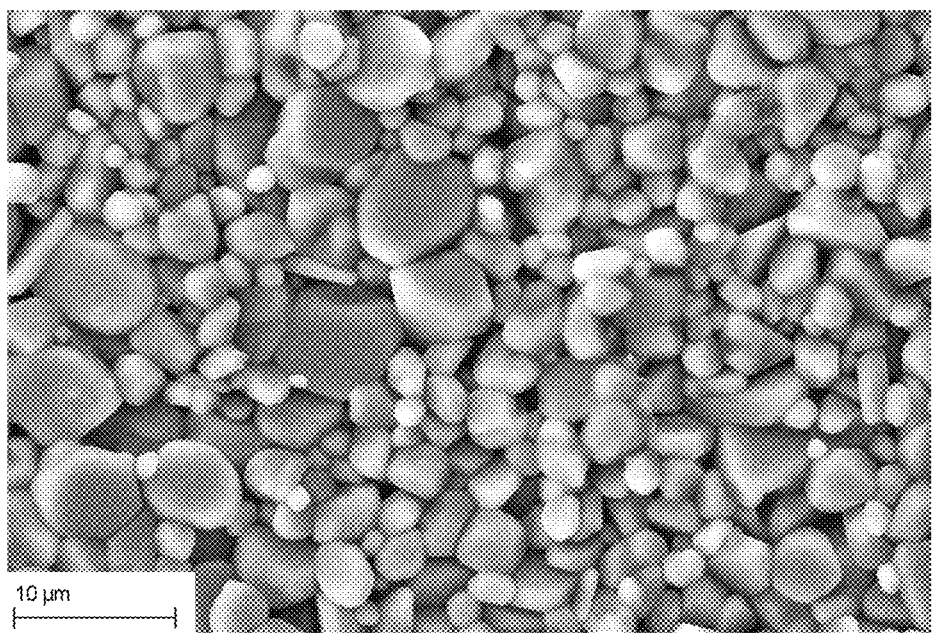
FIG. 5 is a Scanning Electron Micrograph (SEM) image of the surface of the ceramic substrate of a working sample (K-K-V 1), by means of which $Al_2O_3$ grain sizes of the working example were determined.

FIG. 5 shows an SEM image of the surface of the ceramic substrate of K-K-V 1, by means of which the $Al_2O_3$ grain structure was determined.

Figure 6:
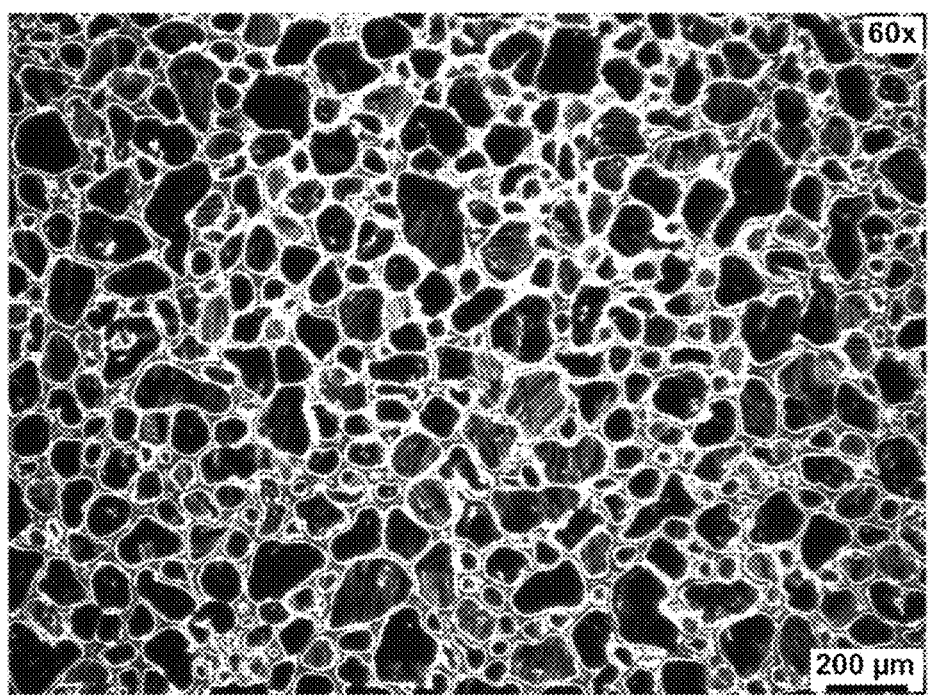
FIG. 6 is an Optical Micrograph of a copper coating of K-K-V 1, by means of which the copper grain structure of the working example was determined.

FIG. 6 shows an optical micrograph of the surface of the copper coating of K-K-V 1, by means of which the copper grain structure was determined.

For each of these three specimens, the thermal shock resistance of the metal-ceramic composite was determined by the following method:

To determine the thermal shock resistance of the copper-ceramic substrate, an individual substrate was broken out from a large card. The individual substrate was subjected in an apparatus known to those skilled in the art to a temperature change cycle made up as follows:

storage at 150° C. (preferably in a first chamber of a temperature change cabinet) for 15 minutes
storage at −40° C. (minus 40° C.) (preferably in a second chamber of the temperature change cabinet) for 15 minutes,
with a transfer time of 15 seconds occurring in the transport from one chamber into the other chamber.

During the course of five cycles (storage at 150° C. to −40° C. and back corresponds to one cycle), the bonding area at the interface between copper and ceramic was in each case examined for delamination by means of an ultrasonic microscope.

The ratios of the average grain shape factors (i.e. $R_a(Al_2O_3)/R_a(Cu)$) and also the results of the thermal shock resistance tests for the composites K-K-V 1, K-K-V 2 and K-K-V 3 are summarized in table 1 below:

TABLE 1

Thermal shock resistance as a function of $R_a(Al_2O_3)/R_a(Cu)$

|  |  | Thermal shock resistance |
|---|---|---|
| Specimen K-K-V 1 (according to the invention) | $R_a(Al_2O_3)/R_a(Cu)$: 1.0 | + |
| Specimen K-K-V 2 (comparison) | $R_a(Al_2O_3)/R_a(Cu)$: 0.2 | − |
| Specimen K-K-V 3 (comparison) | $R_a(Al_2O_3)/R_a(Cu)$: 2.8 | − |

As the examples show, the thermal shock resistance of the copper-ceramic composite can be improved when the average shape of the grains and thus the average grain shape factors of the copper and of the $Al_2O_3$ approximate one another.

The invention claimed is:

1. A copper-ceramic composite comprising:
a ceramic substrate containing grains of aluminum oxide,
a coating composed of copper or a copper alloy present on the ceramic substrate, wherein
the grains of the aluminum oxide each have a maximum diameter $d_{K,max}$, a diameter $d_{K,ortho}$ running perpendicular to $d_{K,max}$, determined on half the length of $d_{K,max}$, and a shape factor $R_K(Al_2O_3)=d_{K,ortho}/d_{K,max}$ and the aluminum oxide has an average grain shape factor $R_a(Al_2O_3)$, determined as arithmetic mean of the shape factors $R_K(Al_2O_3)$ of the grains of the aluminum oxide,
the grains of the copper or of the copper alloy each have a maximum diameter $d_{K,max}$, a diameter $d_{K,ortho}$ running perpendicular to $d_{K,max}$, determined on half the length of $d_{K,max}$, and a shape factor $R_K(Cu)=d_{K,ortho}/d_{K,max}$ and the copper or the copper alloy has an average grain shape factor $R_a(Cu)$, determined as arithmetic mean of the shape factors $R_K(Cu)$ of the grains of the copper or of the copper alloy,
where the average grain shape factors of the aluminum oxide and of the copper or the copper alloy satisfy the following condition:

$$0.5 \leq R_a(Al_2O_3)/R_a(Cu) \leq 2.0,$$

wherein the coating composed of copper or a copper alloy is applied to the ceramic substrate by a direct copper bonding (DCB) process, the DCB process comprising:
oxidizing a copper foil to form a copper oxide layer on the copper foil;
laying the copper foil with the copper oxide layer on the ceramic substrate;
heating the ceramic substrate and copper foil with the copper oxide layer to a temperature ranging from 1025° C. to 1083° C.; and
cooling the heated ceramic substrate and copper foil with the copper oxide layer to room temperature.

2. The copper-ceramic composite of claim 1, wherein the copper or the copper alloy has grain sizes ranging from 10 μm to 300 μm.

3. The copper-ceramic composite of claim 1, wherein the aluminum oxide has grain sizes ranging from 0.01 μm to 25 μm.

4. The copper-ceramic composite of claim 1, wherein the ratio of the average grain shape factor of the aluminum oxide to the average grain shape factor of the copper or of the copper alloy is in the range of 0.75-1.50.

5. The copper-ceramic composite of claim 1, wherein the ceramic substrate contains the aluminum oxide in an amount of at least 65% by weight.

6. The copper-ceramic composite of claim 1, wherein the coating composed of copper or a copper alloy at least partly has structuring to form electrical contact areas.

7. The copper-ceramic composite of claim 1, wherein the coating composed of copper or a copper alloy has a thickness in the range of 0.2-1.2 mm over at least 70% of its area; and the ceramic substrate has a thickness in the range of 0.2-1.2 mm over at least 70% of its area.

8. A module containing at least one copper-ceramic composite according to claim 1 and one or more bond wires.

9. The copper-ceramic composite of claim 1, wherein the coating composed of copper or a copper alloy has a thickness in the range of 0.2-1.2 mm over at least 70% of its area.

10. The copper-ceramic composite of claim 1, wherein the ceramic substrate has a thickness in the range of 0.2-1.2 mm over at least 70% of its area.

11. The copper-ceramic composite of claim 1, wherein the copper or the copper alloy has grain sizes ranging from 15 μm to 250 μm.

12. The copper-ceramic composite of claim 1, wherein the copper or the copper alloy has grain sizes ranging from 20 μm to 210 μm.

13. The copper-ceramic composite of claim 1, wherein the aluminum oxide has grain sizes ranging from 0.3 μm to 23 μm.

14. The copper-ceramic composite of claim 1, wherein the aluminum oxide has grain sizes ranging from 0.5 μm to 20 μm.

15. The copper-ceramic composite of claim 1, wherein the ratio of the average grain shape factor of the aluminum oxide to the average grain shape factor of the copper or of the copper alloy is in the range of 0.80-1.20.

16. The copper-ceramic composite of claim 1, further comprising copper-aluminum spinels between the ceramic substrate and the coating.

17. The copper ceramic composite of claim 1, wherein the ceramic substrate and copper foil with the copper oxide layer are heated to a temperature ranging from 1065° C. to 1083° C.

* * * * *